United States Patent
Spencer et al.

(10) Patent No.: US 10,996,810 B2
(45) Date of Patent: May 4, 2021

(54) WINDOW FOR AN AIRCRAFT AND DISPLAY FOR AIRCRAFT WINDOW

(71) Applicant: Gulfstream Aerospace Corporation, Savannah, GA (US)

(72) Inventors: Stephen Spencer, Savannah, GA (US); Sean Thornton, Savannah, GA (US); John Bullock, Savannah, GA (US)

(73) Assignee: Gulfstream Aerospace Corporation, Savannah, GA (US)

( * ) Notice: Subject to any disclaimer, the term of this patent is extended or adjusted under 35 U.S.C. 154(b) by 0 days.

(21) Appl. No.: 16/421,891

(22) Filed: May 24, 2019

(65) Prior Publication Data
US 2020/0371645 A1 Nov. 26, 2020

(51) Int. Cl.
*G06F 3/048* (2013.01)
*G06F 3/0481* (2013.01)
*B64C 1/14* (2006.01)
*G06F 3/0488* (2013.01)

(52) U.S. Cl.
CPC .......... *G06F 3/0481* (2013.01); *B64C 1/1484* (2013.01); *B64C 1/1492* (2013.01); *G06F 3/0488* (2013.01)

(58) Field of Classification Search
None
See application file for complete search history.

(56) References Cited

U.S. PATENT DOCUMENTS

| | | | | |
|---|---|---|---|---|
| 5,903,247 A | * | 5/1999 | Howard | E06B 9/24 345/87 |
| 6,795,137 B1 | * | 9/2004 | Whitted | G02F 1/1336 349/67 |
| 2008/0042012 A1 | * | 2/2008 | Callahan | B64C 1/1484 244/129.3 |
| 2013/0161971 A1 | | 6/2013 | Ash et al. | |
| 2014/0300830 A1 | * | 10/2014 | Wang | G02F 1/1339 349/5 |
| 2015/0077337 A1 | * | 3/2015 | Coto-Lopez | B64D 11/0015 345/156 |

FOREIGN PATENT DOCUMENTS

| | | |
|---|---|---|
| DE | 102006007283 A1 | 8/2007 |
| EP | 3090947 A1 | 11/2016 |
| EP | 3470327 A1 | 4/2019 |
| EP | 3666649 A1 | 6/2020 |
| WO | 2018119436 A1 | 6/2018 |

* cited by examiner

Primary Examiner — William C Trapanese
(74) Attorney, Agent, or Firm — LKGlobal | Lorenz & Kopf, LLP

(57) ABSTRACT

A window for an aircraft fuselage includes a transparent display for transmitting information to the passenger. The transparent display has a controllable data transmission circuit for varying the light transmission through pixels in the thin film transparent display. Natural light through the window acts as a backlight for the thin film transparent display.

15 Claims, 3 Drawing Sheets

WINDOW FOR AN AIRCRAFT AND DISPLAY FOR AIRCRAFT WINDOW

TECHNICAL FIELD

The present disclosure relates to a window for an aircraft, and more particularly to a window construction for an aircraft having an integrated display unit.

BACKGROUND

This section provides background information related to the present disclosure which is not necessarily prior art.

The desire for improved entertainment for passengers on aircraft has led to an increase in the number of screens for passengers to provide on-demand content. The proliferation of these screens has increased the weight of the aircraft thereby hurting aircraft fuel economy. It is therefore desirable to provide a mechanism which decreases this increased weight without decreasing passenger access to on-demand content.

SUMMARY

This section provides a general summary of the disclosure and is not a comprehensive disclosure of its full scope or all its features.

According to the present teachings, a window for an aircraft and a display for an aircraft window having a transparent outer window member and a separated transparent inner window member are provided.

In a first non-limiting embodiment, the window includes, but is not limited to a transparent outer window member. The window further includes, but is not limited to, a transparent inner window member. The window further includes, but is not limited to, a transparent display disposed between the transparent outer window member and the transparent inner window member. The thin film transparent display is configured to transmit information to a passenger. The window still further includes, but is not limited to, a controllable data transmission circuit configured to provide a signal to the thin film transparent display to vary light transmission through the thin film transparent display.

In another non-limiting embodiment, the window includes, but is not limited to, a transparent outer window member. The window further includes, but is not limited to, a transparent inner window member. The window further includes a thin film transparent display disposed between the transparent outer window member and the transparent inner window member. The thin film transparent display is backlit by light passing through the transparent outer window member and is configured to transmit information to a passenger. The window still further includes, but is not limited to, a circuit that is configured to provide a signal to the thin film transparent display to vary light transmission through the thin film transparent display to display text.

In yet another non-limiting embodiment, the display for an aircraft window includes, but is not limited to, a thin film layer having one of OLEDs and an LCD. The thin film layer is backlit by light passing through the transparent outer window and configured to transmit textual and color pictorial information. The display further includes, but is not limited to, a plurality of sensors configured to provide a signal indicative of the amount of natural light passing through the window.

Further areas of applicability will become apparent from the description provided herein. The description and specific examples in this summary are intended for purposes of illustration only and are not intended to limit the scope of the present disclosure.

BRIEF DESCRIPTION OF THE DRAWINGS

The drawings described herein are for illustrative purposes only of selected embodiments and not all possible implementations and are not intended to limit the scope of the present disclosure.

Corresponding reference numerals indicate corresponding parts throughout the several views of the drawings.

DETAILED DESCRIPTION

Figure 1:
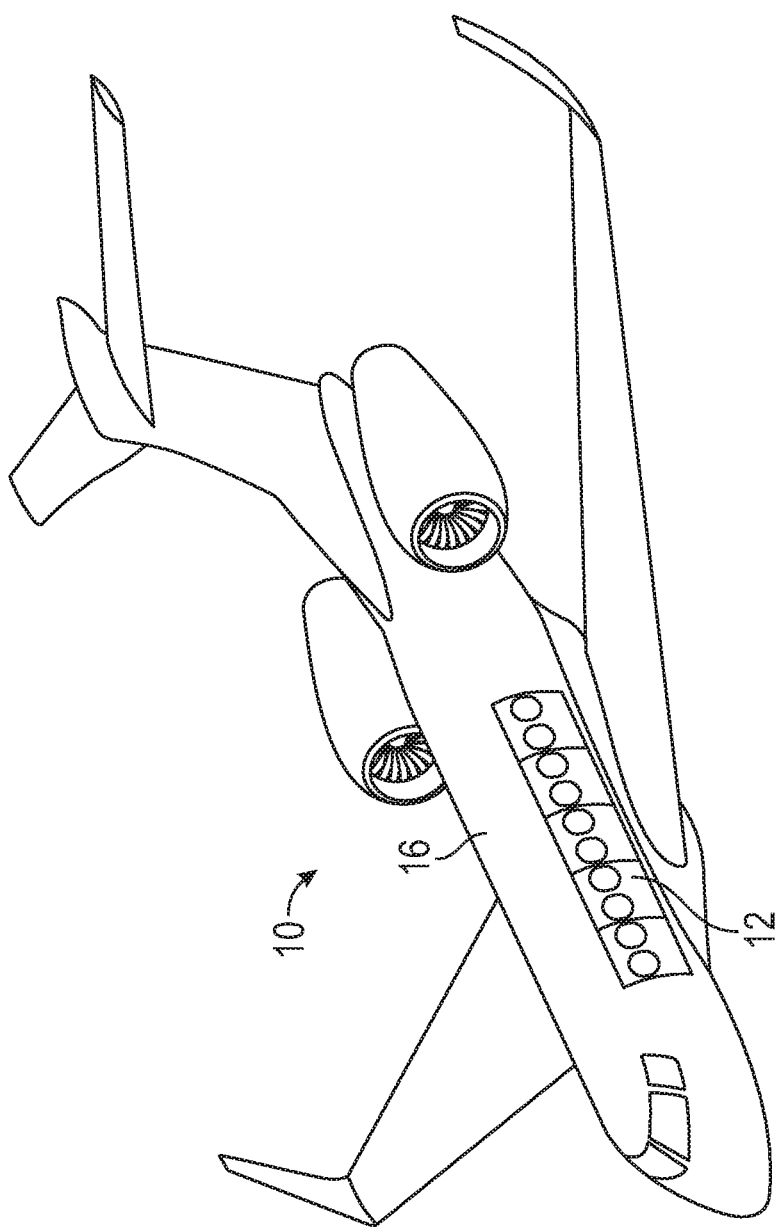
FIG. 1 is a perspective view illustrating an aircraft with a non-limiting embodiment of a window according to the present teachings.
Figure 2:
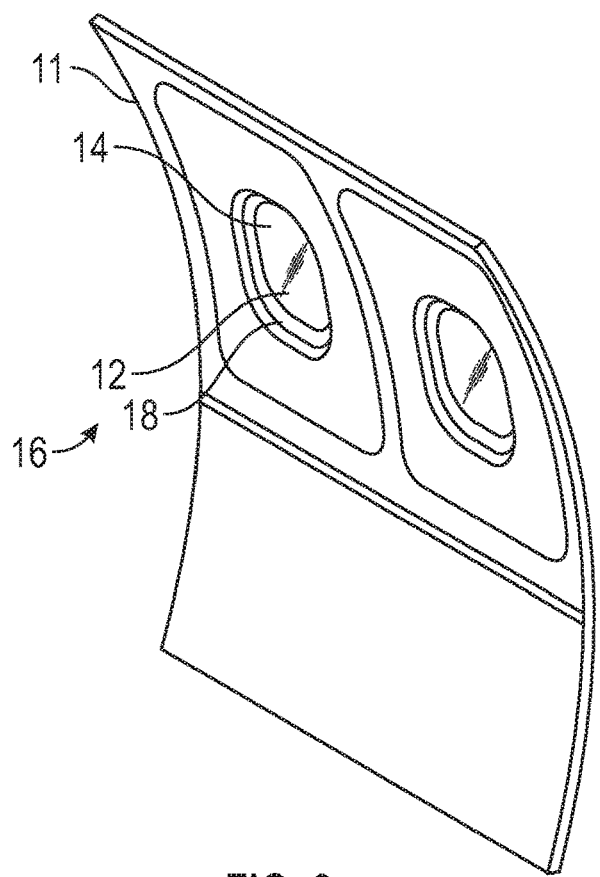
FIG. 2 is a perspective view illustrating an aircraft inner panel including two.

Example embodiments will now be described more fully with reference to the accompanying drawings. FIGS. 1 and 2 respectively show an aircraft 10 with a window display 12 and an associated inner passenger compartment panel 11 according to the present teachings. The window display 12 is configured to be placed between an outer window member 14 of an aircraft passenger compartment 16 and an inner passenger compartment window 18. The window display 12 is configured to provide textual or graphical information to a passenger within the passenger compartment 16. As described below, the display 12 can be releasably fixed to the inner compartment window 18 for ease of repair or replacement. The inner passenger compartment panel 11 can include switches or capacitive sensors (not shown) which allow for the interface by the passenger with the contents of the display 12.

The display 12 includes a transparent (e.g. translucent) display member 20 (see FIG. 3) for transmitting information to the passenger. This transparent display member 20 can be an thin film transparent display member such as LCD display or a transparent thin film having associated OLEDs. Additionally, the display member 20 can be a projection display associated along the frame of the display member The thin film transparent display 20 has a controllable data transmission circuit 22 for varying the light transmission through or from the pixels 24 defined in the thin film transparent display member 20 (see FIG. 3).

Figure 3:
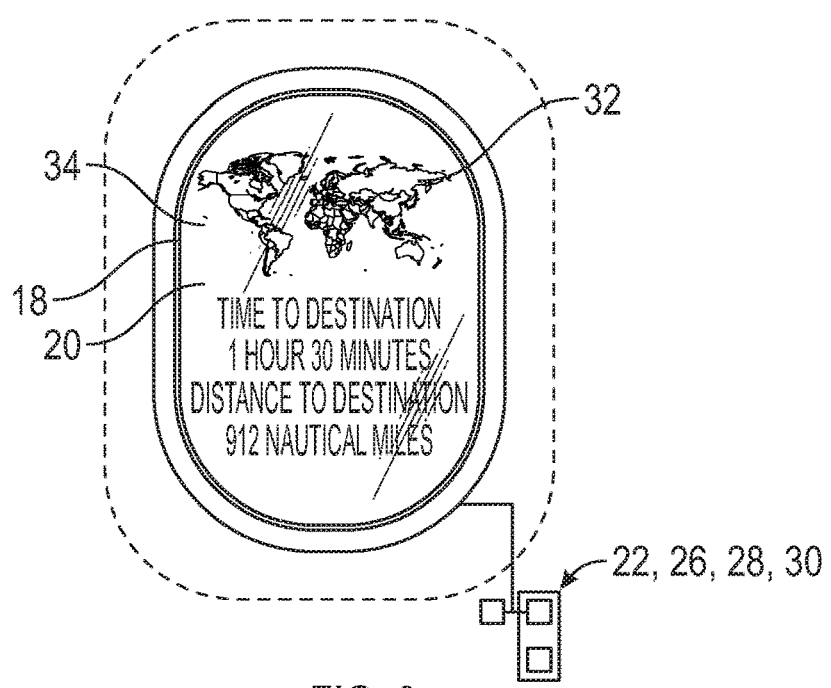
FIG. 3 is a front view of a non-limiting embodiment of a window according to the present teachings.

As best seen in FIG. 3, the controllable data transmission circuit 22 has a plurality of associated sensors (26, 28, 30) which can be used to vary the color or amount of light transmitted through each pixel associated with an image 32. Alternatively, changes the amount or color of or amount of light associated with the background 34 of the display member 20 can be automated to maximize visibility. Because of differences in altitude and positioning of the sun about the earth, there will be large variations in the amount of backlight passing through the outer window member 14 at any given time. Because of the changes in environmental conditions, the associated sensor 30 can be a temperature measuring sensor which will allow the circuit 22 to change currents to the display member as is needed to maintain visual quality or to protect the thin film display.

Additionally, as the internal cabin lighting may be changed during a flight, the visibility of information transmitted by the display member 20 for the passenger can be obscured. As such, the circuit 22 can include a pair of light receiving sensors 26, 28 which determine the amount of light passing through the window assembly and the inner passenger compartment. Both sensors 26, 28 provide a signal indicative of these light values. The controllable data transmission circuit 22 then will calculate a difference in the amount of light between the outside and inside of the cabin and adjust either the darkness or color of pixels sending transmitting information, or the amount of light transmitted through a background.

In the case of an OLED display, the amount of light transmitted by the OLEDS can be adjusted to adjust current or voltage to the OLED to change the visibility of pixels transmitting information or the temperature of the thin film display. Additionally, the display member 20 can incorporate capacitive touch sensors which will allow the passenger to interact with the window display 12 to change the image on the display 12. These touch sensors can use the electrodes of the OLEDS to convert the display member into a capacitive touch pad.

Optionally, the thin display member 20 can include a second layer of LCD or polarizable material (not shown) that can change the overall amount of light transmitted through the inner compartment window 18. It is envisioned that the display member 20 can be used to communicate safety information to the passengers such as a need to remain seated or fasten seat belts. Additional, as shown in FIG. 3, information related to the location of the aircraft along a flight path, viewable items in the ground or sky of interest, or movies can be shown.

Figure 4:
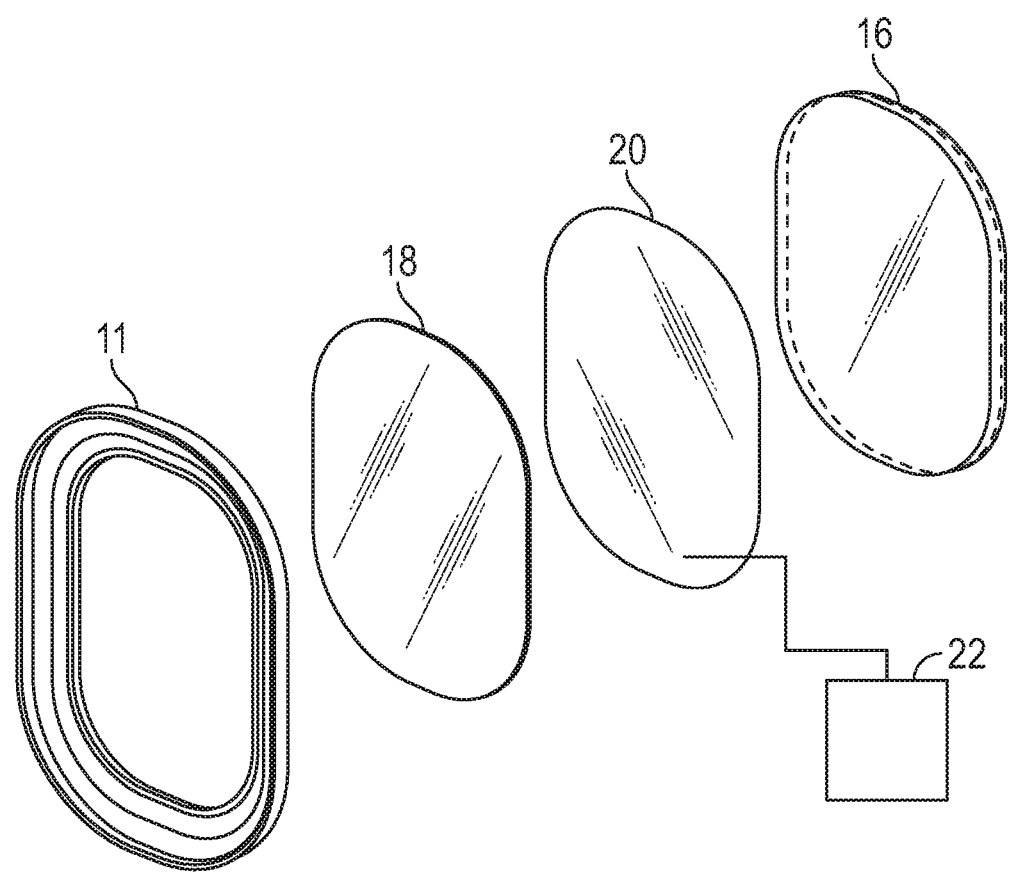
FIG. 4 is an exploded view of the window according to the present teachings.

FIG. 4 represents an exploded view of the window according to the present teachings. Shown is the associated inner passenger compartment panel 11 which can be of the form of a wall panel or a window frame. As shown, the window display 12 is positioned between an outer window member 14 of an aircraft passenger compartment 16 and an inner passenger compartment window 18. To facilitate repair, the display 12 can be releasably fixed to the inner compartment window 18 for ease of access.

Figure 5:
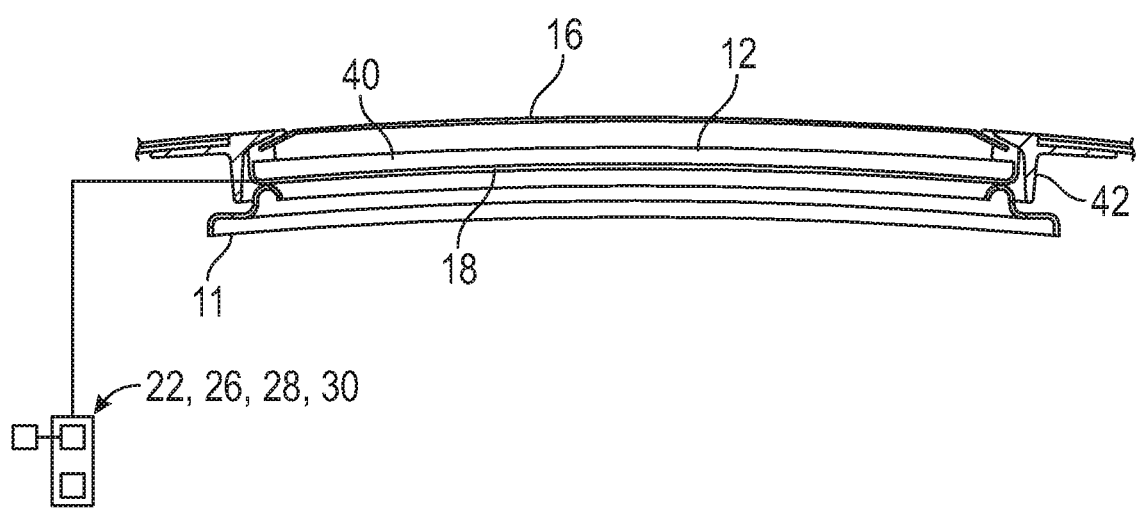
FIG. 5 is a cross-sectional view illustrating a cross section through the window of FIGS. 1-4.

FIG. 5 shows a cross section through an aircraft window with the display member 20. The outer window member 14 and an inner passenger compartment window 18 can have a curved or flat configuration (i.e. planar or substantially planar cross-sectional shape). The outer surface 40 of the inner passenger compartment window 18 is spaced from or offset from the outer window member 14 and the defined fuselage contour. Disposed on the outer surface 40 is the display member 20 which is functionally positioned between the inner and outer window members (18, 16). By coupling the display member 20 to the outer surface 40 of the inner passenger compartment window 18, the display member 20 can be protected from passenger contact. This additionally allows for a frame 42 to be used as a support for the display member 20 and an electrical connector (not shown) for data and power transmission.

Examples of suitable materials for the outer 14 and inner window panels 18 can include, but are not limited to, plastic materials (such as acrylic polymers). Such as polyacrylates; polyalkylmethacrylates, such as polymethylmethacrylates, polyethylmethacrylates, polypropylmethacrylates, stretched acrylic, and the like; polyurethanes; polycarbonates; polyalkylterephthalates, such as polyethyleneterephthalate (PET), polypropyleneterephthalates, polybutylene terephthalates, and the like; polysiloxane-containing polymers; or copolymers of any monomers for preparing these, or any mixtures thereof); glass, such as conventional soda-lime-silicate glass (the glass can be annealed, heat treated, or chemically tempered glass); or combinations of any of the above.

The inner window 18 and outer window 14 are preferably transparent to visible light. By "transparent" is meant having visible light transmission of greater than 0% up to 100%. Alternatively, one or both of the panels 12, 18 can be translucent. The display member or inner or outer window members (14, 18) can include for instance a film which acts a polarizer or light filter which filters out certain incident light frequencies.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

Example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

The terminology used herein is for the purpose of describing particular example embodiments only and is not intended to be limiting. As used herein, the singular forms "a", "an" and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on", "engaged to", "connected to" or "coupled to" another element or layer, it may be directly on, engaged, connected or coupled to the other element or layer, or intervening elements or layers may be present. In contrast, when an element is referred to as being "directly on," "directly engaged to", "directly connected to" or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

Spatially relative terms, such as "inner," "outer," "beneath", "below", "lower", "above", "upper" and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

What is claimed is:

1. A window for an aircraft, the window comprising:
a transparent outer window member;
a transparent inner window member;
a thin film transparent display disposed between the transparent outer window member and the transparent inner window member, the transparent display being configured to display information to a passenger; and
a controllable data transmission circuit configured to provide a signal to the transparent display to vary light transmission through the thin film transparent display, wherein the window further comprises:
a first sensor configured to measure an amount of light from outside the aircraft being transmitted through the thin film transparent display and provide a first signal indicative thereof;
a second sensor configured to measure an amount of light within the passenger compartment and provide a second signal indicative thereof, and wherein the controllable data transmission circuit is configured to measure a difference between the first and second signals; and
a third sensor configured to measure a temperature of the thin film transparent display and provide a third signal indicative thereof, and wherein the controllable data transmission circuit is configured to provide a fourth signal as the signal to the thin film transparent display based on the third signal and the difference between the first and second signals to vary the light transmission through the thin film transparent display.

2. The window according to claim 1, wherein light passing through the transparent outer window member acts as a backlight for the transparent display.

3. The window according to claim 1, wherein the transparent display comprises a plurality of OLEDs.

4. The window according to claim 1, wherein the transparent display comprises a capacitive sensor.

5. A window for an aircraft, the window comprising:
a transparent outer window member;
a transparent inner window member;
a thin film transparent display disposed between the transparent outer window member and the transparent inner window member, the thin film transparent display configured to be backlit by light passing through the transparent outer window member and being configured to present information to a passenger; and
a circuit configured to provide a signal to the thin film transparent display to vary light transmission through the thin film transparent display to display text, wherein the window further comprises:
a first sensor configured to measure the amount of light from outside the aircraft being transmitted through the thin film transparent display and provide a first signal indicative thereof; and
a second sensor configured to measure the amount of light within the passenger compartment and provide a second signal indicative thereof, wherein said circuit is configured to measure a difference between the first and second signals; and
a third sensor configured to measure a temperature of the thin film transparent display and provide a third signal indicative thereof, and wherein the controllable data transmission circuit is configured to provide a fourth signal as the signal to the thin film transparent display based on the third signal and the difference between the first and second signals to vary the light transmission through the thin film transparent display.

6. The window according to claim 5, wherein the thin film transparent display comprises a capacitive sensor.

7. The window according to claim 5, wherein the thin film transparent display comprises an activatable layer configured to adjust the amount of light passing through the thin film transparent display.

8. The window according to claim 5, comprising a frame disposed between the transparent outer window member and the transparent inner window member.

9. The window according to claim 5, comprising a frame disposed between the transparent outer window member and the transparent inner window member.

10. The window according to claim 5, wherein thin film transparent display comprises a plurality of OLEDs.

11. The window according to claim 5, wherein thin film transparent display comprises a LCD.

12. The window according to claim 5, wherein thin film transparent display is coupled a surface of the transparent inner window member.

13. A display for an aircraft window having a transparent outer window member and a spaced apart transparent inner window member, the display comprising:
a thin film layer having one of OLEDs and an LCD, said thin film layer being backlit by light passing through the transparent outer window and configured to transmit textual and color pictorial information;
a plurality of sensors configured to provide a signal indicative of the amount of natural light passing through the window, wherein the plurality of sensors comprises:
a first sensor configured to measure an amount of light from outside the aircraft being transmitted through the thin film transparent display and provide a first signal indicative thereof; and
a second sensor configured to measure an amount of light within the passenger compartment and provide a second signal indicative thereof, wherein the thin film layer comprises a circuit configured to measure a difference between the first and second signals; and a third sensor configured to measure a temperature of the thin film transparent display and provide a third signal indicative thereof, and wherein the controllable data transmission circuit is configured to provide a fourth signal as the signal to the thin film transparent display based on the third signal and the difference between the first and second signals to vary the light transmission through the thin film transparent display.

14. The display according to claim 13, wherein the thin film layer is coupled a surface of the transparent inner window member.

15. The display according to claim 13, wherein the thin film layer comprises an activatable layer configured to adjust the amount of light passing through the window.

* * * * *